United States Patent [19]

Cappon

[11] Patent Number: 4,538,103
[45] Date of Patent: Aug. 27, 1985

[54] TIME DOMAIN REFLECTOMETER APPARATUS FOR IDENTIFYING THE LOCATION OF CABLE DEFECTS

[76] Inventor: John Cappon, 1 Cathcart St., Willowdale, Ontario, Canada, M2M 1E8

[21] Appl. No.: 412,866

[22] Filed: Aug. 30, 1982

[51] Int. Cl.³ .................. G01R 27/04; G01R 31/08
[52] U.S. Cl. ....................................................... 324/52
[58] Field of Search ............... 324/52, 58 R, 58.5 R, 324/58 A, 58 B, 58 C, 58.5 A, 58.5 B, 58.5 C

[56] References Cited

U.S. PATENT DOCUMENTS

| | | | |
|---|---|---|---|
| 3,244,975 | 4/1966 | Bauer | 324/52 X |
| 3,517,306 | 6/1970 | Anderson | 324/52 |
| 3,800,218 | 3/1974 | Sheckel | 324/58 B X |
| 3,909,712 | 9/1975 | Rietz | 324/52 |

Primary Examiner—Stanley T. Krawczewicz
Assistant Examiner—Jose M. Solis
Attorney, Agent, or Firm—Robert S. Smith

[57] ABSTRACT

A time domain reflectometer apparatus for testing a cable and for cooperation with an oscilloscope or other display apparatus which includes structure for generating a first plurality of pulses which are positive going and for generating a second plurality of pulses which are negative going and which are each synchronized with one of the positive going pulses. The apparatus also includes structure for applying at least one of the pluralities of pulses to a cable to be tested, for cooperating with the associated display apparatus, for providing a display of at least reflective pulses from the cable being tested and for bucking the positive going pulses with the negative going pulses to minimize the amplitude displayed of the pulses being supplied to the cable being tested.

8 Claims, 9 Drawing Figures

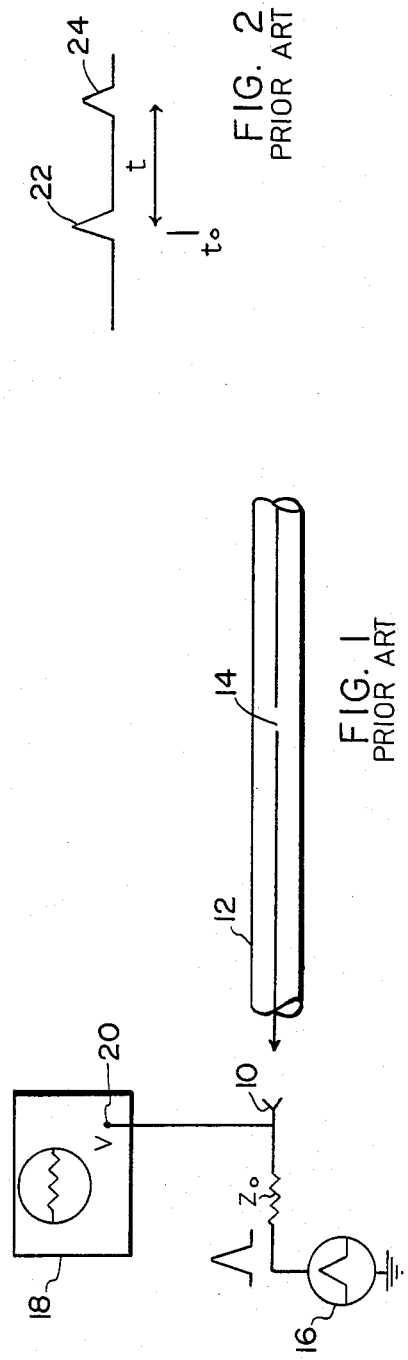
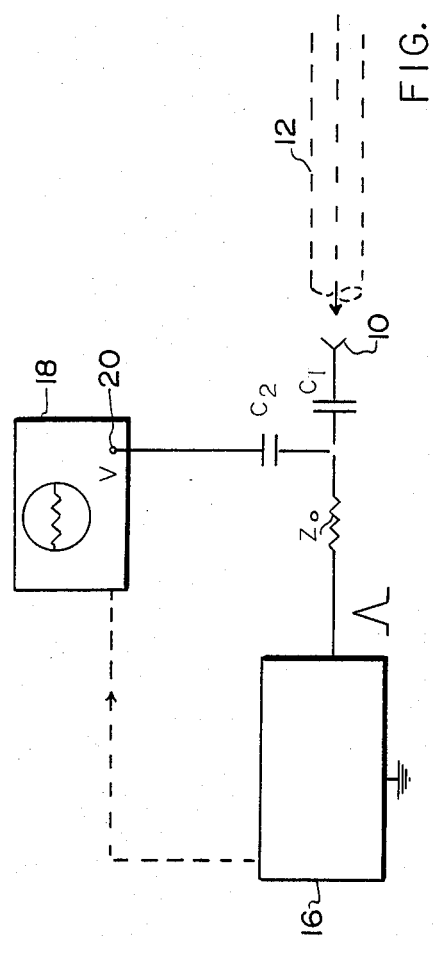

4,538,103

TIME DOMAIN REFLECTOMETER APPARATUS FOR IDENTIFYING THE LOCATION OF CABLE DEFECTS

BACKGROUND OF THE INVENTION

The invention relates to time domain reflectometer (TDR) apparatus and particularly to apparatus which enable the user to identify the location of defects such as breaks in a cable very close to the point where the time domain reflectometer apparatus is attached to the cable.

A time domain reflectometer is an instrument designed to indicate and to measure reflection characteristics of a transmission system connected to the instrument by monitoring the step-formed signals entering the test object and the superimposed reflected transient signals on an oscilloscope equipped with a suitable timebase sweep. The measuring system, basically, consists of a fast-rise step-function generator, a tee coupler, and an oscilloscope connected to the probing branch of the coupler.

When the transmission line, "under test", includes passive devices which are not capable of returning the low frequency components of the wave form, then a short duration pulse wave form is sometimes substitued for the step function wave form.

A disadvantage of such apparatus which is generally available is that it is difficult to distinguish between a break in the center conductor which is very close to the point which is attached to the output port of the reflectometer and a perfect cable which is terminated. The difficulty arises because the reflected pulse is masked by the "zero pulse" or step-formed signals which are being introduced into the cable. Stated another way, the physical display of the "zero pulse" and the reflected pulse will be substantially superimposed and thus the display will appear as a single pulse, which would indicate a perfect cable. This is obviously undesirable since the fault is not detected.

Time domain reflectometers are typically used to test radio frequency transmission cables such as 50 or 75 ohm cables. The invention has particular application to testing of coaxial cables such as those used for cable television. Other applications include telephone cables and other lines which have a somewhat uniform impedance. The circuit values given herein will be understood to refer to 75 ohm cable testing although those skilled in the art will understand how the concepts disclosed herein may be utilized in testing other lines. Television and telephone cables may often be buried underground and may be broken accidentally, such as during installation or repair of other services. The identification of the spot in the cable in which the break has occurred may be a difficult procedure.

Another problem arises when a low frequency signal is present on the cable to be tested. For example, it is quite common to have a 60 V ac 60 Hz signal on the cable of a Cable TV system. This ac signal will make it impossible to identify the TDR trace.

It is an object of the invention to provide apparatus which enables the simple and inexpensive testing of a cable which will identify defects which are disposed even at a point which is close to the point at which the time domain reflectometer apparatus is attached to the cable being tested.

Another object of the invention is to provide apparatus which will greatly reduce the display of the 60 Hz signal which may be present on the cable such that the TDR display will not be affected.

SUMMARY OF THE INVENTION

The foregoing objects and other objects and advantages which shall become apparent from the detailed description of the preferred embodiment are attained in a time domain reflectometer apparatus for testing an associated cable which cooperates with an associated oscilloscope or other display apparatus which includes means for generating a first plurality of pulses which are positive going, means for generating a second plurality of pulses which are negative going and which are each synchronized with one of the positive going pulses, and means for applying one of the pluralities of pulses to the cable being tested. The apparatus also includes means for cooperation with the associated display apparatus for providing a display of at least reflected pulses from the cable being tested and means for bucking the positive going pulses with the negative going pulses to minimize the amplitude displayed of the pulses being supplied to the cable being tested.

In some forms of the invention the apparatus includes delaying means for substantially synchronizing the negative going pulses and the positive going pulses. In various forms the apparatus includes amplifying means for increasing the strength of the signal being applied to the cable being tested and the amplifying means may include a single transistor amplification stage. The delay means may include at least one AND gate and means for generating the first plurality of pulses and the means for generating the second plurality of pulses may include at least one monostable multivibrator.

BRIEF DESCRIPTION OF THE DRAWING

The invention will be better understood by reference to the accompanying drawing in which:

FIG. 1 is a schematic view of a circuit illustrating the principal of time domain reflectometry.

FIG. 2 is a representation of a representative oscilloscope trace produced when testing a cable having a break in it with conventional test apparatus.

FIG. 3 is a schematic view of a time domain reflectometer which illustrates generally the present invention.

DESCRIPTION OF THE PREFERRED EMBODIMENT

Figures 4, 5, 5A, 5B, 5C, 5D:
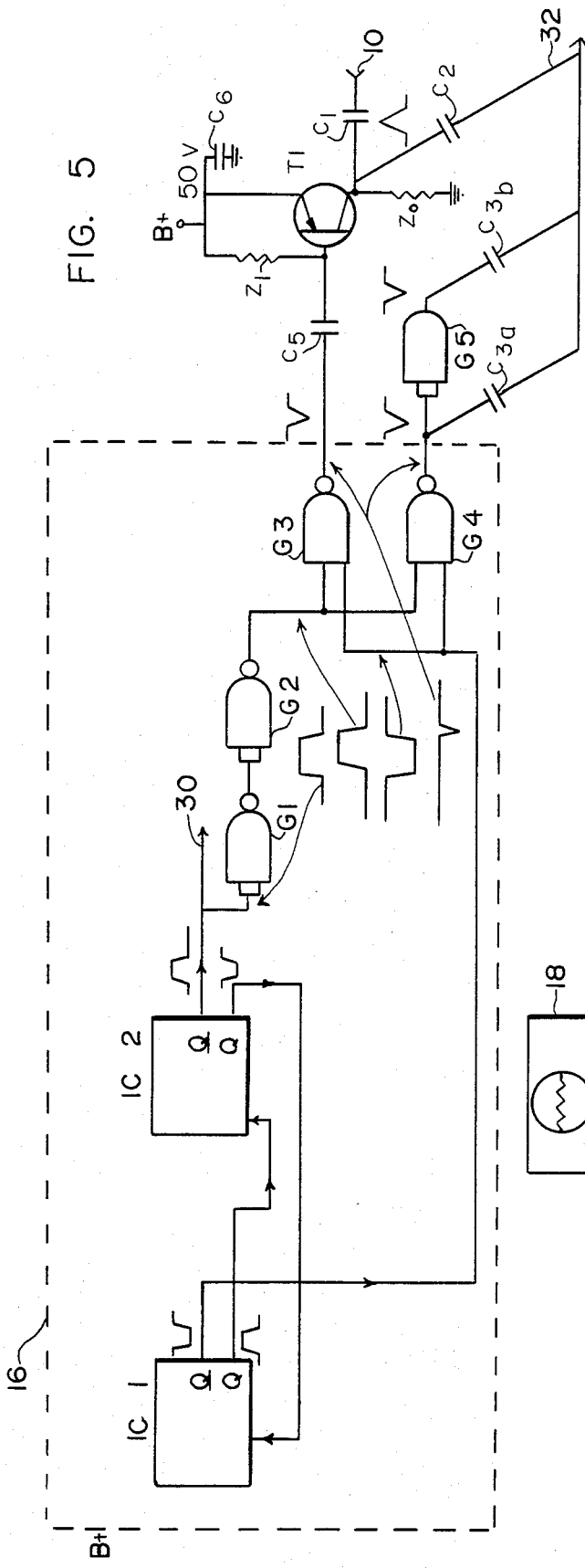
FIG. 4 is a schematic view of a time domain reflectometer in accordance with a relatively simple form of the apparatus in accordance with the present invention.
FIG. 5 is a schematic view of another form of the apparatus in accordance with the invention.
FIGS. 5a to 5d illustrate oscilloscope wave forms.

Referring now to FIG. 1 there is shown a simple time domain reflectometer apparatus which includes an output port 10 for connection to a cable 12 which is to be tested. The cable 12 has a defect 14 at a point which is axially spaced from the extremity of the cable 12 which is connected to the output port 10. The apparatus includes a pulse generator 16 which is coupled by input impedance $Z_0$ of 75 ohms to the output port 10. Also coupled to the output port 10 is an oscilloscope 18 having a vertical input 20. As best seen in FIG. 2 the "zero pulse" 22 is displayed at time $t_0$. At a finite time interval thereafter t indicated by spacing to the right, the reflected pulse 24 is displayed. In the example given, let us assume that the defect is disposed twenty meters to the right (as viewed) of the connection to the output port 10 and that the characteristics of the cable being tested are such that the propagation velocity of the signal from the output port 10 will move at a velocity which is 0.8 times the speed of light. The "round trip" delay between the time the pulse was applied and the time the reflected pulse was received, may be computed as follows:

$$t = 2 \times 20 / (3 \times 10^8) \times 1/0.8 = 166 \times 10^{-9}$$
seconds = 166 nano seconds.

In this equation the numeral 2 is included because the signal travels back and forth. The numeral 20 represents the distance in meters between the output port 20 and the defect 14 in the cable being tested. The value $3 \times 10^8$ is the value in meters per second of the speed of light. The 0.8 factor is a correction factor defining the speed at which the signal travels in the particular cable being tested in relation to the propagation velocity of light.

The difficulty of distinguishing between the zero pulse 22 and the reflected pulse 24 will be apparent by reference to FIG. 2 wherein the zero pulse 22 and the reflected pulse 24 are illustrated.

Referring now to FIG. 3 there is shown a time domain reflectometer illustrated in a simplified schematic form. As in FIG. 1, the same pulse generator 16 and oscilloscope 18 and cable 12, which is being tested, are shown. The circuit includes an input impedance $Z_0$ of 75 ohms, a high value direct current blocking capacitor $C_1$, which in the preferred embodiment, has a value of 0.01 microfarads. The low value coupling capacitor $C_2$ is connected intermediate the impedance $Z_0$ and the high value direct current blocking capacitor $C_1$ and also to the vertical input V of the oscilloscope 18. The capacitor $C_2$ in this preferred embodiment has a value of 8 picofarads. The low value prevents the low frequency signals, which may be present on the cable, from interfering with the TDR display. A trigger pulse is supplied from the pulse generator 16 to the oscilloscope 18 to provide the necessary synchronization. It will be understood that the apparatus described in FIG. 3 suffers from some of the drawbacks which have been described in the Background of the Invention section of this application.

Referring more particularly now to FIG. 4, there is shown one solution which prevents an erroneous interpretation by providing additional circuitry which effectively cancels the display of the "zero pulse" when the output port is terminated in its characteristic load impedance. The circuit is conceptually similar to that illustrated in FIG. 3 except that in addition to the connection to the positive going pulse output 26 of the pulse generator 16 which is connected to the impedance $Z_0$, there is also provided a connection to a negative going pulse output 28 of the pulse generator 16 via a low value coupling capacitor $C_3$ (which in this preferred embodiment has a value of 4 picofarads) to the conductor extending between the vertical input 20 of the oscilloscope 18 and the low value coupling capacitor $C_2$. All other circuit values and wiring remain the same.

There is shown in FIG. 5 a more detailed schematic view of a preferred embodiment of the apparatus in accordance with the invention. The apparatus in FIG. 5 achieves the same result with different circuitry. The apparatus includes elements identified as IC 1 and IC 2 for the purpose of the schematic. In reality these two elements are a single 74123 digital TTL IC (integrated circuit) having two multivibrator sections. The 74123 TTL IC is a dual retriggerable monostable multivibrator.

The IC 1 section is wired with external circuitry including a B+ power supply (not shown) to provide a 100 nano second monostable multivibrator to trigger the oscilloscope sweep circuitry in advance of the "zero pulse". Similarly, the element identified as IC 2 also has associated circuitry including a B+ power supply (not shown) to provide a 5 microsecond monostable multivibrator to set the pulse repetition rate. The Q output of IC 1 will be going positive at almost the same time as the Q output of IC 2 is going negative. The Q output of the IC 2 is connected via terminal 30 to the horizontal trigger terminal of the oscilloscope 18 (omitted for simplicity in FIG. 5) which triggers on the positive going pulse. The Q output of IC 2 goes from +5 to 0 volts concurrently with the Q output of IC 1 going from 0 to +5 volts, as is indicated symbolically in FIG. 5. The Q output of the IC 2 is also applied to the serially arranged NAND gates G1 and G2. The output of the NAND gate G2 is fed to one input terminal of the NAND gates G3 and G4. The other input terminal of each of the NAND gates G3 and G4 is supplied with the output from the Q terminal of the IC 1. The outputs of the NAND gates G3 and G4 are the outputs of the pulse generator 16 corresponding to elements 26, 28 in FIG. 4, except for the polarity of the pulses, which provides output pulses which are concurrent and identically shaped. (In FIG. 5 the enclosed box 16 indicates the pulse generator corresponding to the pulse generator 16 in FIG. 4.)

A negative going pulse reaching the NAND gates G1 and G2 is slowed down due to the propagation effects of the NAND gates G1 and G2 thus the signals from the gate G2 reach the gates G3 and G4 after the output signals from IC 1 which are not slowed in the same manner, since they are wired directly to the gates G3 and G4. In practice the gates G1, G2, G3 and G4 are all in a single 7400 IC. They have been illustrated and identified separately merely for convenience in describing the circuit. The Gates G3 and G4 will thus initially open as the positive going pulse from IC 1 reaches them. As soon as the negative going pulse from IC 2 reaches the gates G3 and G4 the gates G3 and G4 will shut. Thus, a negative going pulse is produced out of both of the gates G3 and G4.

A negative going pulse out of the Gate G3 is coupled by a capacitor $C_5$ of 330 picofarads value to the base of transistor T1. A 100 kohm impedance $Z_1$ is connected to a 50 volt B+ supply and the base of the transistor T1. The emitter of the transistor T1 is connected to the B+ and by a capacitor $C_6$, having a value of 0.1 microfarads, to ground. Coupled to the collector of the transistor T1 is a high value direct current blocking capacitor $C_1$ which is coupled to the output port 10 of the apparatus which joins with the cable 12 (not shown) which is to be tested.

The transistor T1 is basically an amplifier. The impedance $Z_1$ serves to hold the transistor T1 in a cut off mode of operation, that is, without any current flow through the transistor T1. The impedance $Z_0$ has a value of 75 ohms as in the other circuits described herein. As soon as the negative going pulse out of the gate G3 reaches the transistor T1, the transistor T1 momentarily creates a pulse across the impedance $Z_0$. (The transistor T1 in the preferred embodiment is a 2N2905A.)

The output of the gate G4 is coupled to the vertical input 20 of an oscilloscope 18 (such as that shown in FIG. 4) by a capacitor $C_{3a}$ and also via the 7408 AND gate G5 and a capacitor $C_{3b}$.

The apparatus in accordance with the invention effectively cancels the display of the "zero pulse" when the output port is terminated, that is, it is loaded with it's characteristic impedance.

When the output 10 is not terminated the output of the "zero pulse" at 32 is only partly cancelled, in other words the amplitude of the zero pulse signal at 32 is reduced. When the cable 12 is terminated with 75 ohms, the signal from the transistor T1 is reduced due to the extra load while the capacitors $C_2$, $C_{3a}$, and $C_{3b}$ are chosen such that the resultant output at 32 is zero. As soon as the load is taken off, the signal from the transistor T1 increases, and one of the three pulses is different and therefore do not cancel each other resulting in the pulse being displayed. For example, if there is a 5 volt positive going pulse available from the transistor T1, via $C_2$ when the cable is open, then when the cable is loaded with 75 ohm, whether that is due to a terminated cable or a 75 ohm resistor, the voltage will drop. Assume the voltage drops to 3 volts via $C_2$, then to cancel this signal a negative going 3 volts pulse is required to arrive via $C_{3a}$ and $C_{3b}$. If now the terminator is taken off, there will be a 2 volt pulse displayed because the 5 volt positive going pulse is not completely cancelled by the 3 volt negative going pulse so the overall result is that there is 2 volt positive pulse displayed.

Referring to FIG. 5a to 5d, the wave forms are illustrated for respectively terminated (75 ohm); output port open; unterminated (short cable open); and unterminated (long cable, open) conditions. These wave forms will be displayed on the oscilloscope 18 (not shown in FIG. 5).

There is a delay in the transistor T1 so cancellation or bucking does not occur if the pulses from the gate G4 are not delayed substantially the same amount as the delay that occurs in the transistor T1. The delay of the pulses from the gate G4 is introduced with an AND gate G5 (A NAND gate would reverse polarity and is unacceptable.) If the transistor T1 delays the signal by 15 nanoseconds and the NAND gate delays it by 20 nanoseconds, it is acceptable to provide a portion of signal at no delay through capacitor $C_{3a}$ and a portion of the signal too late through capacitor $C_{3b}$. Between the two there will be a pulse which is about 15 nanoseconds late. Thus two signals of two different delays are mixed to obtain an in between value.

The scope will show both the transmitted and the received pulse wave forms. First, there is displayed in FIG. 5a the cancellation of the "zero pulse" when port 10 is properly terminated (proper load and no reflections). FIG. 5b shows the scope display with partial cancellation of the zero pulse, when the output port 10 is left open. No cable is connected, therefore no delayed reflections are displayed. FIG. 5c shows the scope trace when a short cable is connected to the output port. The short cable does not terminate the output port, therefore the zero pulse will show, the cable is open therefore a reflection is received, which is displayed, to the right of the zero pulse. The display is similar to the display in FIG. 2 except for the zero pulse which is partially cancelled (the amplitude is less than usual), while the reflection is displayed with full amplitude. In FIG. 5d, there is shown a cancelled "zero pulse" since a long cable even when open will terminate the output port 10. A reflected pulse from the end of this long open cable will return and be displayed to the right of the zero pulse. FIG. 5a shows the scope trace of a properly terminated cable. FIG. 5b represents an open port with no cable attached. The difference between this open port and a terminated cable can now be distinguished.

Although the description of the invention has been described in terms of a positive going pulse being used to test a cable it will be understood that a negative going pulse may also be used to test a cable.

The invention has been described with reference to its illustrated preferred embodiment. Persons skilled in the art may, upon exposure to the teachings herein, conceive variations in the components therein. For example, display apparatus other than a conventional oscilloscope may be used. Such variations are deemed to be encompassed by the disclosure, the invention being delimited only by the appended claims.

Having thus described my invention, I claim:

1. A time domain reflectometer apparatus for testing a cable and for cooperation with an oscilloscope or other display apparatus which comprises:
   means for generating a first plurality of pulses which are positive going;
   means for generating a second plurality of pulses which are negative going and which are each synchronized with one of said positive going pulses;
   means for applying at least one of said pluralities of pulses to the cable being tested;
   means for cooperation with the associated display apparatus for providing a display of at least reflected pulses from the cable being tested;
   means for bucking said positive going pulses with said negative going pulses to minimize the amplitude displayed of the pulses being supplied to the cable being tested; and
   means for delaying at least some of said pulses for substantially synchronizing said negative going pulses and said positive going pulses.

2. The apparatus as described in claim 1, wherein: said apparatus includes amplifying means for increasing the amplitude of said pulses being applied to the cable being tested.

3. The apparatus as described in claim 2, wherein: said amplifying means includes a single transistor amplification stage.

4. The apparatus as described in claim 3, wherein: said delay means includes at least one AND gate.

5. The apparatus as described in claim 4, wherein: said means for generating said first plurality of pulses and said means for generating said second plurality of pulses includes at least one monostable multivibrator.

6. The apparatus as described in claim 1, further including:
   means for preventing low frequency signals from interfering with the time domain reflectometer display on the associated display apparatus.

7. The apparatus as described in claim 2, further including:
   means for preventing low frequency signals from interfering with the time domain reflectometer display on the associated display apparatus.

8. The apparatus as described in claim 5, further including:
   means for preventing low frequency signals from interfering with the time domain reflectometer display on the associated display apparatus.

* * * * *